(12) United States Patent
Oh et al.

(10) Patent No.: US 7,973,578 B2
(45) Date of Patent: Jul. 5, 2011

(54) TIME-TO-DIGITAL CONVERTER AND ALL-DIGITAL PHASE-LOCKED LOOP

(75) Inventors: Do-hwan Oh, Seoul (KR); Kyo-Jin Choo, Seoul (KR); Deog-Kyoon Jeong, Seoul (KR)

(73) Assignees: Samsung Electronics Co., Ltd., Suwon-si (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 12/627,229

(22) Filed: Nov. 30, 2009

(65) Prior Publication Data

US 2010/0134165 A1 Jun. 3, 2010

Related U.S. Application Data

(60) Provisional application No. 61/118,693, filed on Dec. 1, 2008.

(30) Foreign Application Priority Data

Aug. 19, 2009 (KR) ........................ 10-2009-0076780

(51) Int. Cl.
*H03L 7/06* (2006.01)
(52) U.S. Cl. ........................................ 327/158; 327/149
(58) Field of Classification Search .................. 327/149, 327/158
See application file for complete search history.

(56) References Cited

U.S. PATENT DOCUMENTS

| | | | |
|---|---|---|---|
| 5,790,613 A | 8/1998 | Tateishi | |
| 6,429,693 B1 * | 8/2002 | Staszewski et al. | 327/12 |
| 6,593,773 B2 * | 7/2003 | Staszewski et al. | 326/46 |
| 6,993,109 B2 * | 1/2006 | Lee et al. | 375/376 |
| 7,196,778 B2 * | 3/2007 | Lin et al. | 356/5.01 |
| 7,304,510 B2 * | 12/2007 | Matsuta | 327/3 |
| 7,403,073 B2 * | 7/2008 | Kossel et al. | 331/16 |
| 7,501,973 B2 * | 3/2009 | Choi et al. | 341/166 |
| 7,522,084 B2 * | 4/2009 | Huang et al. | 341/157 |
| 7,667,633 B2 * | 2/2010 | Choi et al. | 341/166 |
| 7,706,496 B2 * | 4/2010 | Youssoufian | 375/376 |
| 7,786,776 B2 * | 8/2010 | Yamakido et al. | 327/158 |
| 7,791,377 B2 * | 9/2010 | Kim et al. | 327/2 |
| 7,804,925 B2 * | 9/2010 | Scholz et al. | 375/371 |
| 7,812,644 B2 * | 10/2010 | Cha et al. | 327/3 |
| 7,839,221 B2 * | 11/2010 | Kossel et al. | 331/16 |
| 7,884,751 B2 * | 2/2011 | Shimizu et al. | 341/166 |
| 2003/0169086 A1 * | 9/2003 | Lee et al. | 327/158 |
| 2007/0096836 A1 | 5/2007 | Lee et al. | |
| 2008/0111720 A1 | 5/2008 | Huang et al. | |
| 2008/0129574 A1 * | 6/2008 | Choi et al. | 341/166 |
| 2008/0136698 A1 * | 6/2008 | Choi et al. | 341/155 |

(Continued)

*Primary Examiner* — Lincoln Donovan
*Assistant Examiner* — Adam D Houston
(74) *Attorney, Agent, or Firm* — Sughrue Mion, PLLC

(57) ABSTRACT

A time-to-digital converter (TDC) includes a converter which receives a first signal and a second signal, delays the second signal in phases using a plurality of delay elements which are coupled in series, compares the delayed second signal with the first signal, and outputs a phase error of the second signal with respect to the first signal, a phase frequency detector which receives the first signal, and a third signal from one of the nodes in the plurality of delay elements, and outputs a phase difference between the first signal and the third signal, and a frequency detector which outputs a frequency error of the second signal with respect to the first signal as a digital code using an output signal of the phase frequency detector and the second signal.

15 Claims, 7 Drawing Sheets

U.S. PATENT DOCUMENTS

| | | | |
|---|---|---|---|
| 2009/0225631 A1* | 9/2009 | Shimizu et al. | 368/113 |
| 2009/0267664 A1* | 10/2009 | Uozumi et al. | 327/158 |
| 2009/0273384 A1* | 11/2009 | Kojima et al. | 327/262 |
| 2009/0307518 A1* | 12/2009 | Hsieh | 713/501 |
| 2010/0097150 A1* | 4/2010 | Ueda et al. | 331/25 |
| 2010/0134165 A1* | 6/2010 | Oh et al. | 327/158 |
| 2010/0134335 A1* | 6/2010 | Park et al. | 341/118 |
| 2010/0156485 A1* | 6/2010 | Madoglio et al. | 327/158 |
| 2010/0182060 A1* | 7/2010 | Fujino et al. | 327/159 |
| 2010/0259435 A1* | 10/2010 | Yamamoto et al. | 341/166 |
| 2010/0289541 A1* | 11/2010 | Wu | 327/158 |
| 2010/0321065 A1* | 12/2010 | Wada et al. | 326/93 |
| 2011/0007859 A1* | 1/2011 | Ueda et al. | 375/376 |

\* cited by examiner (a) CLK lagging
QUp=0, QDn=0

(b) CLK lagging
QUp=1, QDn=0

TIME-TO-DIGITAL CONVERTER AND ALL-DIGITAL PHASE-LOCKED LOOP

CROSS-REFERENCE TO RELATED APPLICATIONS

This application claims priority from Korean Patent Application No. 10-2009-0076780, filed on Aug. 19, 2009, in the Korean Intellectual Property Office, and U.S. provisional application No. 61/118,693, filed on Dec. 1, 2008, in the U.S. Patent and Trademark Office, the disclosure of which is incorporated herein by reference in its entirety.

BACKGROUND OF THE INVENTION

1. Field of the Invention

Apparatuses and methods consistent with the present invention relate to a time-to-digital converter (TDC) and an all-digital phase-locked loop (ADPLL) using the same, and more particularly, to a time-to-digital converter capable of detecting not only a phase difference between two input signals, but also a frequency difference, and an all-digital phase-locked loop using the same.

2. Description of the Related Art

As technology has been developing, all-digital phase-locked loops (ADPLLs) have recently been explored as an alternative for charge-pump phase-locked loops (CPPLLs) to overcome the shortcomings of analog circuits in the advanced process technology. A time-to-digital converter (TDC) is a key component of ADPLLs, that is intended to perform an equal function as a phase-frequency detector (PFD) used in related art CPPLLs.

However, a related art TDC such as a delay-line based TDC, a stochastic TDC, a time-amplifying TDC, and a ring-oscillator based TDC behave only as a phase-detector (PD) due to its small pull-in range. In addition, such a PD can operate only when the difference between two frequencies is extremely small. The pull-in range for existing TDCs will be reduced as the loop bandwidth is decreased to reduce jitter.

To overcome this problem, some applications adopted a bang-bang PFD in place of a TDC to detect a phase. However, the phase-alignment accuracy of the bang-bang PFD is poor. Therefore, there is a need for a TDC capable of detecting both a phase error and a frequency error.

SUMMARY OF THE INVENTION

Exemplary embodiments of the present invention address at least the above problems and/or disadvantages and other disadvantages not described above. Also, the present invention is not required to overcome the disadvantages described above, and an exemplary embodiment of the present invention may not overcome any of the problems described above.

An aspect of the present invention provides a TDC capable of detecting both phase difference and frequency difference between two signals, and an ADPLL using the same.

According to an exemplary aspect of the present invention, there is provided a time-to-digital converter (TDC) including a converter which receives a first signal and a second signal, delays the second signal in phases using a plurality of delay elements which are coupled in series, compares the delayed second signals with the first signal, and outputs a phase error of the second signal with respect to the first signal, a phase frequency detector which receives the first signal, and a third signal from one of the nodes in the plurality of delay elements, and outputs a phase difference between the first signal and the third signal, and a frequency detector which outputs a frequency error of the second signal with respect to the first signal as a digital code using an output signal of the phase frequency detector and the second signal.

The converter may include a delay line which comprises the plurality of delay elements which are coupled in series, and receives the first signal through a start node; a plurality of comparators which compare phases of the nodes in the delay line with a phase of the second signal, and an encoder which outputs the phase error of the second signal with respect to the first signal as a digital code based on the plurality of comparators.

The delay element may be at least one of an inverter, a buffer, a resistor, and a resistor-capacitor (RC) delay circuit.

The comparator may be a flip-flop.

The TDC may further include an output device which changes the phase error output by the converter if the frequency error is input from the frequency detector.

The output device may change the phase error to a minimum value if a phase of the second signal is lagging behind a phase of the first signal, and the output device may change the phase error to a maximum value if a phase of the first signal is lagging behind a phase of the second signal.

The TDC may further include a ring oscillator which is coupled with a plurality of delay elements in a feedback loop form, and outputs a preset oscillation frequency, and a counter which counts a period of the first signal and a period of the second signal using the oscillation frequency output by the ring oscillator.

One of the first signal and the second signal may be a reference frequency.

According to another exemplary aspect of the present invention, there is provided an all-digital phase-locked loop (ADPLL) including a digital control oscillator which receives a digital control signal and generates an oscillation frequency, a converter which receives a reference frequency, and the oscillation frequency generated by the digital control oscillator, delays the oscillation frequency in phases using a plurality of delay elements which are coupled in series, compares the delayed oscillation frequency with the reference frequency, and outputs a phase error of the oscillation frequency with respect to the reference frequency, a phase frequency detector which receives the reference frequency, and a third signal from an intermediate node in the plurality of delay elements, and outputs a phase difference between the reference frequency and the third signal, a frequency detector which outputs a frequency error of the oscillation frequency with respect to the reference frequency as a digital signal using an output signal of the phase frequency detector and the oscillation frequency, and a digital loop filter which provides the digital control oscillator with the digital control signal based on the phase error output by the converter and the frequency error output by the frequency detector.

The converter may include a delay line which comprises the plurality of delay elements which are coupled in series, and receives the oscillation frequency through a start node; a plurality of comparators which compare phases of the nodes in the delay line with a phase of the reference frequency, and an encoder which outputs the phase error of the oscillation frequency with respect to the reference frequency as a digital code based on the plurality of comparators.

The delay element may be at least one of an inverter, a buffer, a resistor, and a resistor-capacitor (RC) delay circuit.

The comparator may be a flip-flop.

The converter may further include an output device which changes the phase error output by the converter if the frequency error is input from the frequency detector.

The output device may change the phase error to a minimum value if a phase of the oscillation frequency is lagging behind a phase of the reference frequency, and the output device may change the phase error to a maximum value if a phase of the reference frequency is lagging behind a phase of the oscillation frequency.

The converter may further include a ring oscillator which is coupled with a plurality of delay elements in a feedback loop form, and outputs a preset oscillation frequency, and a counter which counts a period of the reference frequency and a period of the oscillation frequency using the oscillation frequency output by the ring oscillator.

BRIEF DESCRIPTION OF THE DRAWINGS

The above and/or other aspects of the present invention will be more apparent by describing certain exemplary embodiments of the present invention with reference to the accompanying drawings, in which.

DETAILED DESCRIPTION OF EXEMPLARY EMBODIMENTS OF THE INVENTION

Figure 1:
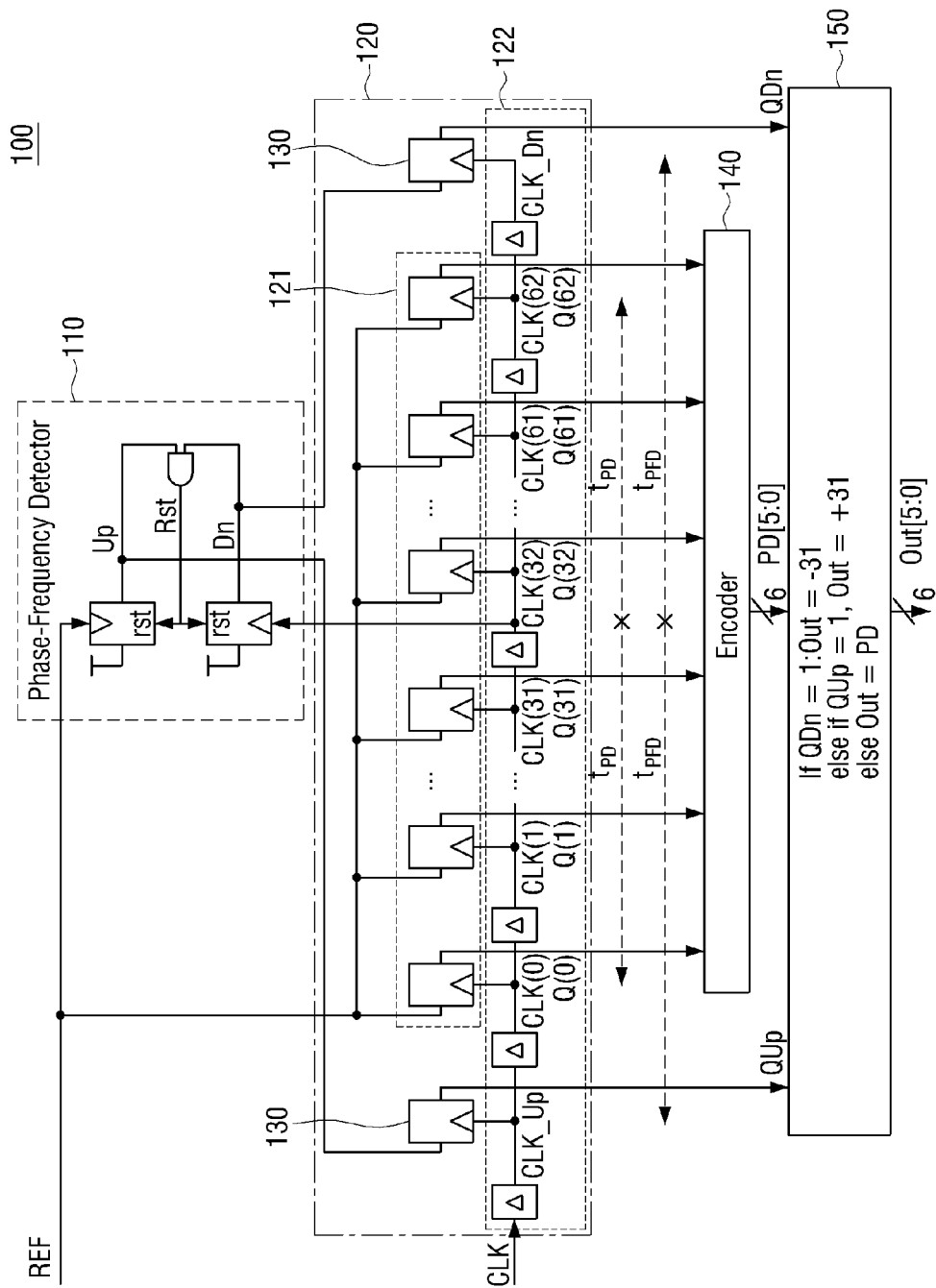
FIG. 1 is a circuit diagram of a TDC according to an exemplary embodiment of the present invention.

Certain exemplary embodiments of the present invention will now be described in greater detail with reference to the accompanying drawings.

In the following description, like drawing reference numerals are used for like elements, even in different drawings. The matters defined in the description, such as detailed construction and elements, are provided to assist in a comprehensive understanding of the invention. However, the present invention can be practiced without those specifically defined matters. Also, well-known functions or constructions are not described in detail since they would obscure the invention with unnecessary detail.

FIG. 1 is a circuit diagram of a time-to-digital converter (TDC) 100 according to an exemplary embodiment of the present invention. Referring to FIG. 1, the TDC 100 may include a phase-frequency detector (PFD) 110, a converter 120, a frequency detector 130, and an output device 150.

The PFD 110 receives two signals, and outputs a phase difference between the two signals. More specifically, the PFD 110 receives a first signal (REF), and a third signal (CLK(32)) from one of the nodes of a plurality of delay elements, and outputs a phase difference between the first signal (REF) and the third signal (CLK(32)) using a pulse wave.

In FIG. 1, the PFD 110 includes two D flip-flops and an AND logic element. The first signal (REF) is input as a clock signal for one of the D flip-flops, and output (CLK(32)) of an intermediate node in a delay line 121 of the converter 120 is input as a clock signal of the other D flip-flop. The two D flip-flops receive a fixed signal "1" as a data signal, and receives output of the AND logic element as a reset signal.

Figure 3:
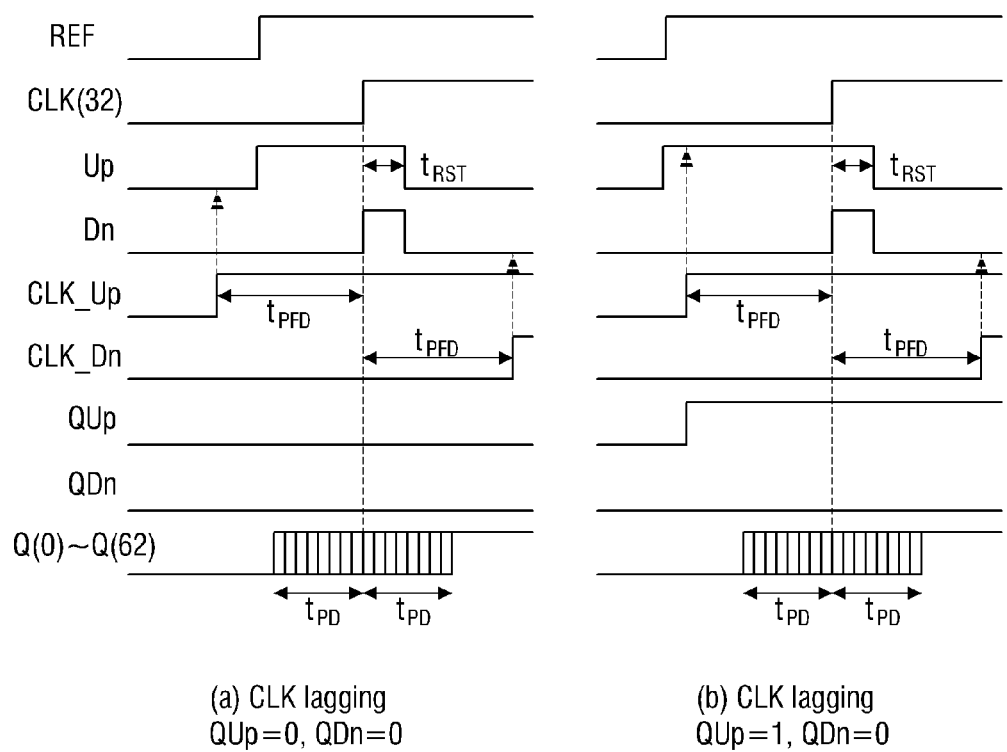
FIG. 3 illustrates an input and output waveform of a TDC according to an exemplary embodiment of the present invention.

Operation of the PFD 110 is described in greater detail with reference to FIG. 3. As illustrated in FIG. 3, the PFD 110 outputs output signals (Up, Dn) which have been changed on a rising edge of two signals (REF, CLK(32)). In FIG. 3, since a phase of the first signal (REF) precedes a phase of the third signal (CLK(32)), the PFD 110 changes an "Up" signal to "1" on the rising edge of the first signal (REF), and changes a "Dn" signal to "1" on the rising edge of the third signal (CLK(32)).

Since values of the "Up" signal and the "Dn" signal are "1," the two D flip-flops in the PFD 110 are reset. Accordingly, the PFD 110 changes the "Dn" signal and the "Up" signal to "0" after a reset delay time ($t_{RST}$) from the rising edge of the third signal (CLK(32)).

Therefore, the PFD 110 can output pulse waves (Up, Dn) corresponding to the phase difference between the first signal (REF) and the third signal (CLK(32)).

FIG. 3 shows that the phase of the first signal (REF) precedes the phase of the third signal (CLK(32)). However, if the phase of the third signal (CLK(32)) precedes the phase of the first signal (REF), the PFD 110 changes a "Dn" signal to "1" on the rising edge of the third signal (CLK(32)), and changes the "Dn" signal to "0" after a reset delay time ($t_{RST}$) from the rising edge of the first signal (REF).

The converter 120 receives a first signal (REF) and a second signal (CLK), and calculates a time difference between the first signal (REF) and the second signal (CLK). More specifically, the converter 120 receives the first signal (REF) and the second signal (CLK), delays the second signal (CLK) in phases using the plurality of delay elements which are coupled in series, compares the delayed second signals (CLK(0)-CLK(62)) with the first signal (REF), and outputs a binary code corresponding to a time delay between the first signal (REF) and the second signal (CLK). In greater detail, the converter 120 may include a plurality of comparators 121, a delay line 122, and an encoder 140.

The delay line 122 may include a plurality of delay elements which are coupled in series, and receives the second signal (CLK) through a start node. More specifically, the delay line 122 receives the second signal (CLK) through the start node, and delays the second signal (CLK) in phases using the plurality of delay elements. Accordingly, the delayed second signals (CLK(0)-CLK(62)) are input to comparators corresponding to each delay phase, respectively. The delay elements may be implemented with inverters, buffers, resistors, resistor-capacitor (RC) delay circuits, or the like.

The plurality of comparators 121 compare the delayed second signals (CLK(0)-CLK(62)) with the first signal (REF). More specifically, the plurality of comparators 121 receive the first signal (REF) as an input data signal, and receive the delayed second signals (CLK(0)-CLK(62)) as a clock signal. Accordingly, the plurality of comparators 121 compare a phase of the first signal (REF) with phases of the delayed second signals (CLK(0)-CLK(62)) and thus outputs a plurality of output signals (Q(0)-Q(62)). In FIG. 1, the plurality of comparators 121 are implemented with D flip-flops, and may also be implemented with JK flip-flops or latch elements.

The encoder 140 outputs a phase error of the second signal (CLK) with respect to the first signal (REF) as a digital code based on the output (Q(0)-Q(62)) of the plurality of comparators 121. More specifically, the second signal (CLK) is delayed in phases, so phases of the delayed second signals (CLK(0)-CLK(62)) are lagging behind a phase of the first signal (REF) after a point of time. Accordingly, the comparator which receives the delayed second signal having a phase lagging behind the first signal (REF) generates an output which is different from a comparator of a previous node. Therefore, the encoder can output a phase error between the two signals as a digital code using the delay time of the delay elements and the outputs (Q(0)-Q(62)) of the plurality of comparators 121. In FIG. 1, the encoder 140 is included in the converter 120, and may also be implemented as a separate component or be included in the output device 150.

FIG. 1 shows that the converter 120 delays the second signal (CLK) using a single delay line. The converter 120 may increase resolution of the TDC 100 using two delay lines having a different delay time.

The frequency detector 130 receives the output signals (Up, Dn) of the PFD 110 and the second signals (CLK_Up, CLK_Dn) delayed by the converter 120, and outputs a frequency error of the second signal (CLK) with respect to the first signal (REF) as a digital code. More specifically, the frequency detector 130 includes two flip-flops. One flip-flop receives an "Up" signal of the PFD 110 as a data signal and receives the delayed second signal (CLK-Up) as a clock signal. The other flip-flop receives a "Dn" signal of the PFD 110 as a data signal and receives the delayed second signal (CLK-Up) as a clock signal. Operation of the frequency detector 130 is described later in greater detail with reference to FIG. 3.

If the output device 150 receives a frequency error detected by the frequency detector 130, the output device 150 changes a phase error value of the converter 120. Operation of the output device 150 is described in greater detail with reference to FIG. 2.

Figure 2:
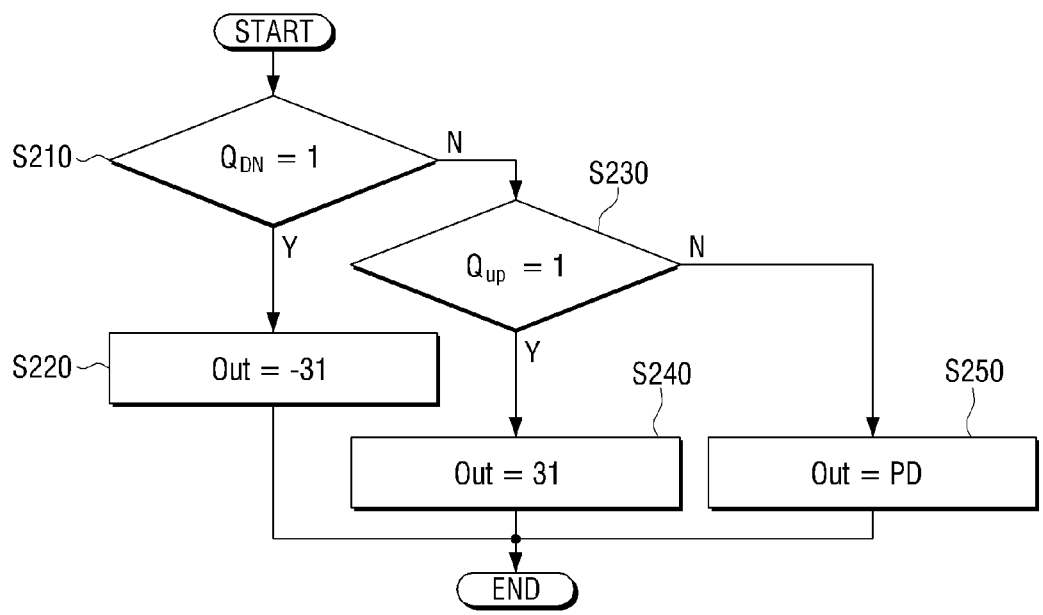
FIG. 2 is a flow chart illustrating operation of an output device shown in FIG. 1.

FIG. 2 is a flow chart illustrating operation of the output device 150. Referring to FIG. 2, the output device 150 determines if the frequency detector 130 outputs a frequency error ($Q_{DN}$ signal). If a value of the $Q_{DN}$ signal is 1, the output device 150 changes output of the encoder 140, that is, a phase error value (PD[5:0]) between the first signal (REF) and the second signal (CLK) to a minimum value (−31). Alternatively, the output device 150 determines if the frequency detector 130 outputs a frequency error ($Q_{UP}$ signal). If a value of the $Q_{UP}$ signal is 1, the output device 150 changes output of the encoder 140, that is, a phase error value (PD[5:0]) between the first signal (REF) and the second signal (CLK) to a maximum value (+31). Alternatively, if the frequency detector 130 does not output a frequency error ($Q_{UP}$ signal or $Q_{DN}$ signal), the output device 150 outputs a value output by the encoder 140 as it is. In FIG. 2, it is determined first if a value of the $Q_{DN}$ signal is 1. However, it may also be possible to determine first if a value of the $Q_{UP}$ signal is 1.

Accordingly, the TDC 100 according to this exemplary embodiment of the present invention can detect a frequency error as well as a phase error between two input signals. That is, the TDC 100 according to this exemplary embodiment of the present invention can have a pull-in range wider than a related art TDC.

In FIG. 1, an exemplary embodiment in which the first signal is input as a reference frequency signal is described. However, it may also be possible that the second signal is input as a reference frequency signal and the first signal is input as a CLK signal.

FIG. 3 illustrates an input and output waveform of the TDC 100 according to an exemplary embodiment of the present invention. In FIG. 3, a phase of the second signal (CLK) is lagging behind a phase of the first signal (REF).

Referring to (a) of FIG. 3, since an "Up" signal of the PFD 110 is not wide enough, a Qup signal is not output. Accordingly, digitalized Q(0)-Q(62) signals corresponding to the phase difference between the first signal (REF) and the delayed second signal (CLK) are output.

Referring to (b) of FIG. 3, an "Up" signal of the PFD 110 is a pulse wave wider than a phase detecting range ($t_{PD}$) of the converter 120, so the frequency detector 130 can output a Qup signal.

As illustrated in FIG. 3, only when $t_{PFD}$ has a wide range, the Qup signal from the sampled Up signal can be prevented from outputting phase error values (Q(0)-Q(62)) to become "0." This condition can be expressed as the following mathematical expression:

$$t_{PFD} > t_{PD} + t_{RST}$$ [Mathematical expression 1]

In Mathematical expression 1, $t_{RST}$ is a pulse width of a reset pulse of the PFD 110, and $t_{PD}$ is a phase range which can be detected by the converter 120. A setup, and a hold time margin of a sampler may complicate the above calculation. However, the problem can be solved by adding a time margin of the sampler to $t_{PFD}$.

In the exemplary embodiment of the present invention as illustrated in FIG. 3, the second signal (CLK) is lagging behind the first signal (REF). However, even when the second signal (CLK) is leading the first signal (REF), an input and output waveform has a form similar to that of FIG. 3.

Figure 4:
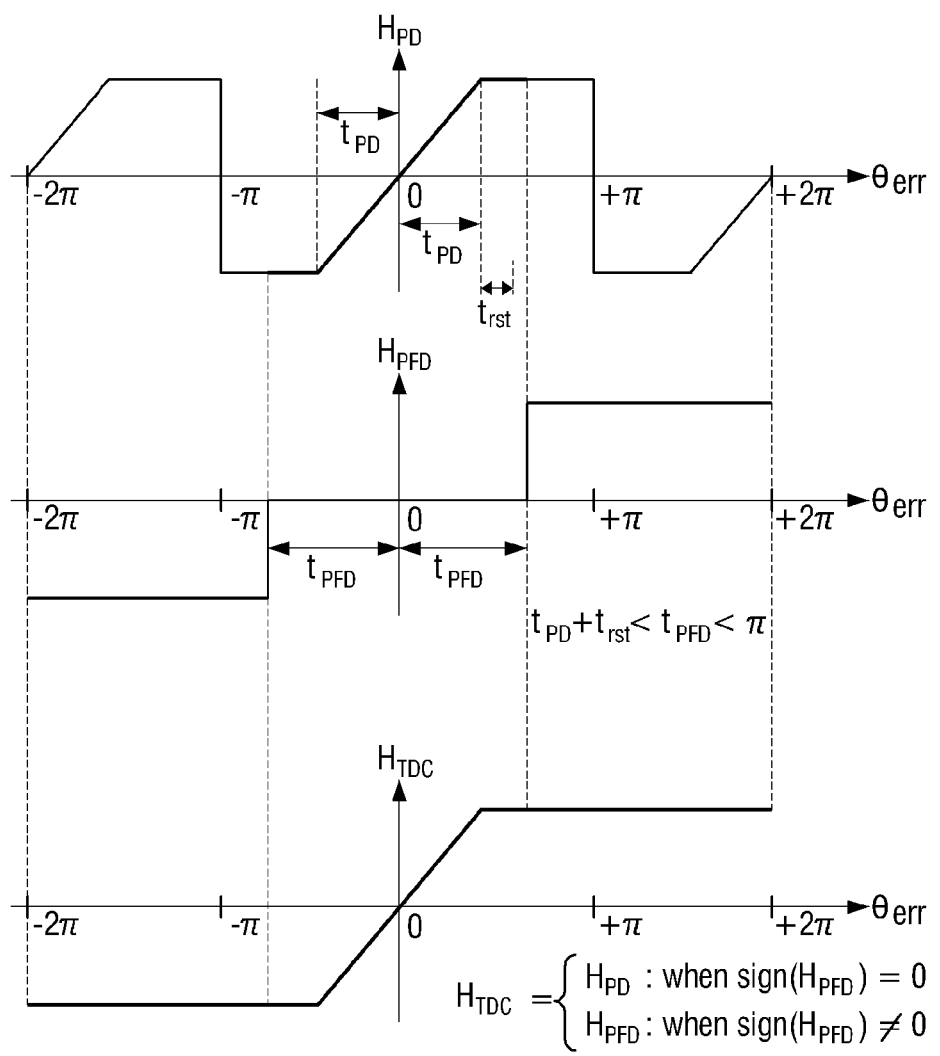
FIG. 4 illustrates a transfer function of a TDC according to an exemplary embodiment of the present invention.

FIG. 4 illustrates a transfer function of the TDC 100 according to an exemplary embodiment of the present invention.

A related art phase detector has a problem with a pull-in range in that a sign is reversed in a range in which a phase error is greater than π as illustrated in the highest transfer function of FIG. 4.

However, a transfer function ($H_{TDC}$) of the TDC 100 according to an exemplary embodiment of the present invention has the same form as a transfer function ($H_{PD}$) of a related art phase detector in a range in which a phase error (θerr) is smaller than $t_{PFD}$, that is, maintains linearity at the origin. To prevent a sign from being reversed in a range in which a phase error is greater than π, the transfer function ($H_{TDC}$) is converted into $H_{PFD}$ if a phase error (θerr) is greater than $t_{PFD}$.

Therefore, a sign of the TDC 100 according to the exemplary embodiment of the present invention is not reversed in a range in which a phase error is greater than π, and the TDC 100 maintains linearity in the remaining range as in a related art TDC, thereby possibly resolving the pull-in range problem.

Figure 5:
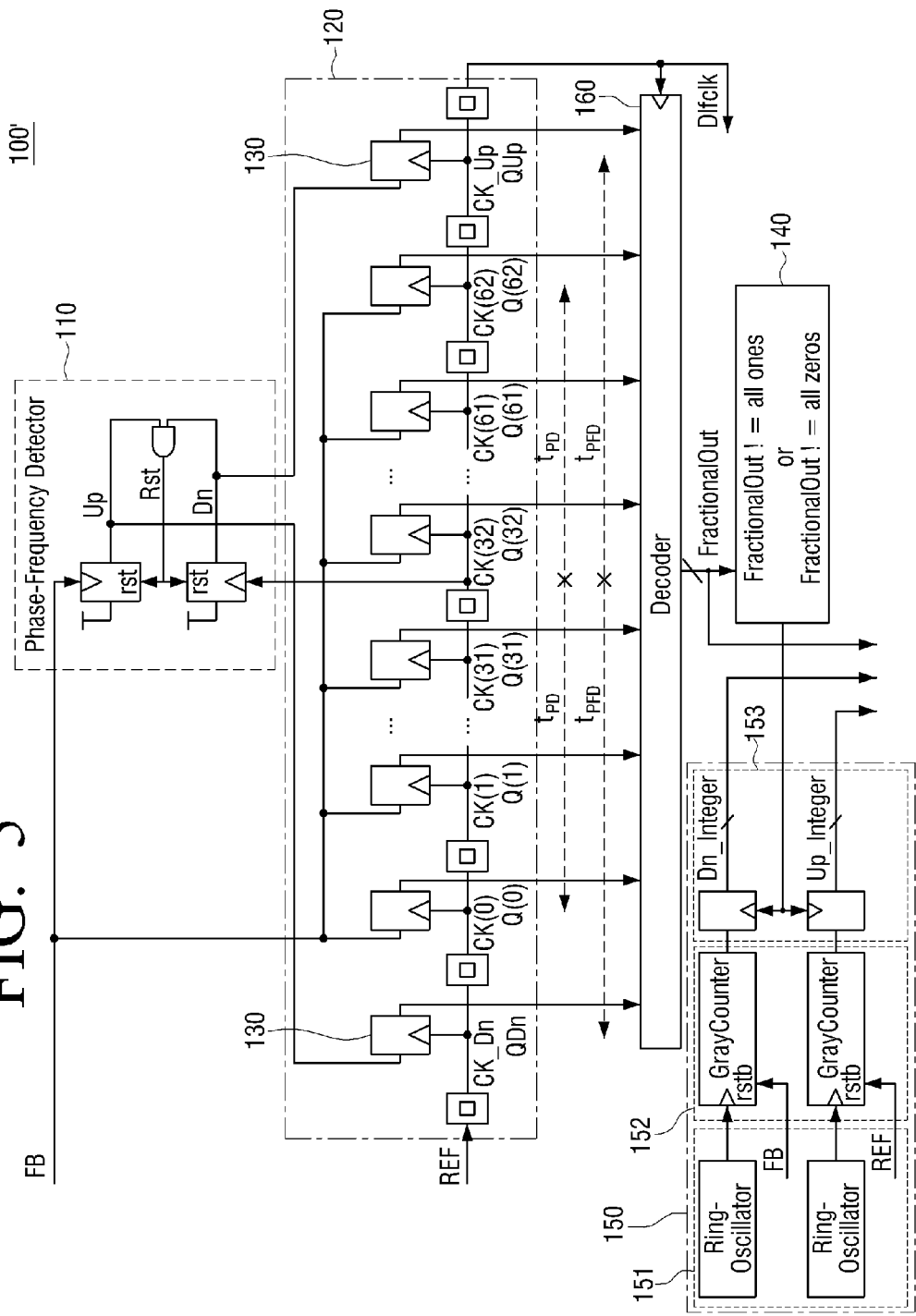
FIG. 5 is a circuit diagram of a TDC according to another exemplary embodiment of the present invention.

FIG. 5 is a circuit diagram of a TDC 100' according to another exemplary embodiment of the present invention.

Referring to FIG. 5, the TDC 100' may further include a ring oscillator 151, a counter 152, and two flip-flops 153, compared with the TDC 100 illustrated in FIG. 1.

The ring oscillator 151 is coupled with a plurality of delay elements through a feedback loop, and outputs a preset oscillation frequency. The counter 152 counts a period of a first signal (REF) and a period of a second signal (CLK) using the oscillation frequency output by the ring oscillator 151.

If the two flip-flops 153 receive a frequency error value from a frequency detector 130, the two flip-flops 153 output period values of the first signal (REF) and the second signal (CLK). If the two flip-flops 153 do not receive a frequency error value from a frequency detector 130, the two flip-flops 153 are reset, and do not output period values of the first signal (REF) and the second signal (CLK).

Accordingly, since the TDC 100' according to another exemplary embodiment of the present invention additionally includes the ring oscillator 151 and the counter 152, the TDC 100' can output, not only the presence or absence of a frequency error between the first signal (REF) and the second signal (CLK), but also a degree of the frequency error, that is, periods of the first signal (REF) and the second signal (CLK). A transfer function of the TDC 100' is illustrated in FIG. 6.

Figure 6:
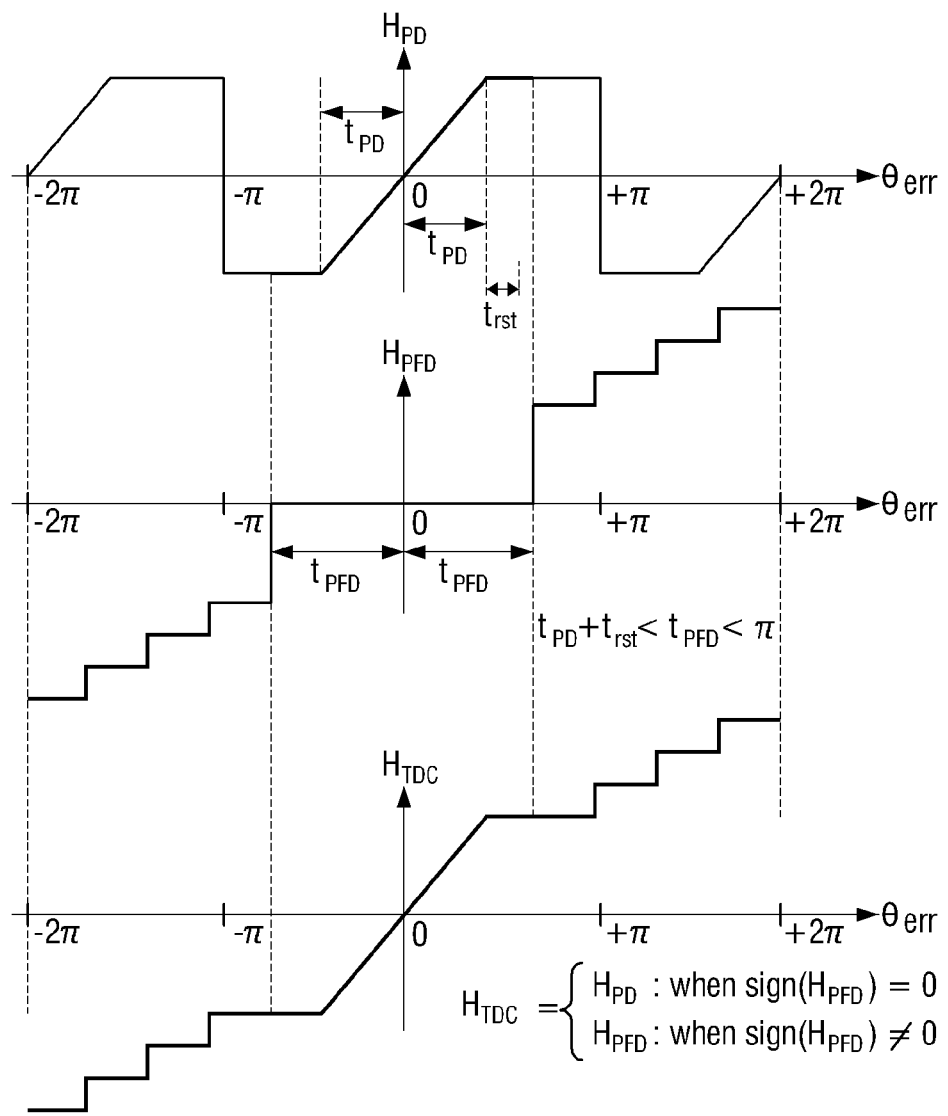
FIG. 6 illustrates a transfer function of a TDC according to another exemplary embodiment of the present invention.

Referring to FIG. 6, the transfer function of the TDC 100' has a stair shape when a phase error is greater than $t_{PFD}$. In this case, a resolution becomes a period of the ring oscillator 151. Accordingly, if the TDC 100' is used as a component of an all-digital phase-locked loop (ADPLL), frequency fixing can be rapidly performed.

Figure 7:
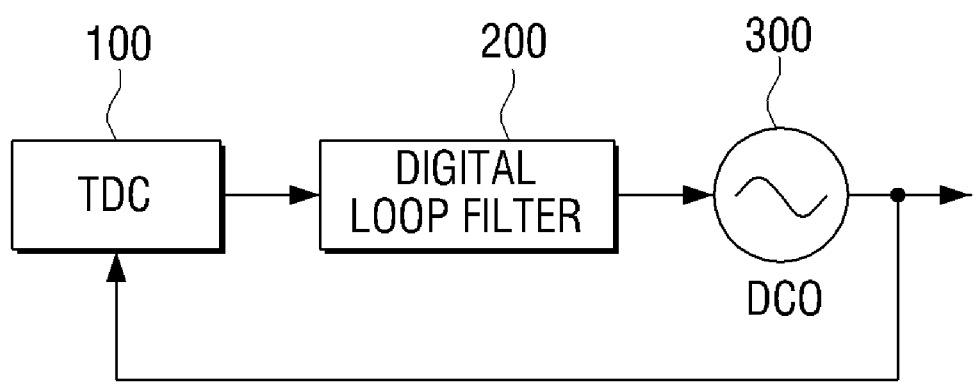
FIG. 7 is a block diagram of an ADPLL according to an exemplary embodiment of the present invention.

FIG. 7 is a block diagram of an ADPLL according to an exemplary embodiment of the present invention.

As illustrated in FIG. 7, the ADPLL 1000 may include a TDC 100, a digital loop filter 200, and a digital control oscillator 300.

The digital control oscillator 300 receives a digital control signal and generates an oscillation frequency. More specifically, the digital control oscillator 300 receives a digital control signal, and generates an oscillation frequency corresponding to the digital control signal by adjusting a variable capacitor and a variable inductor which are mounted in the digital control oscillator 300. The digital control oscillator 300 may be implemented with a digital-based circuit, and may also be implemented with a related art voltage control oscillator (VCO).

The TDC 100 receives a reference frequency, and the oscillation frequency generated by the digital control oscillator 300, and detects a phase error and a frequency error between the reference frequency and the oscillation frequency. More specifically, the TDC 100 receives the reference frequency, and the oscillation frequency generated by the digital control oscillator 300, delays the oscillation frequency in phases using a plurality of delay elements which are coupled in series, and compares the delayed oscillation frequency with the reference frequency. The TDC 100 may include a converter to output a phase error between the reference frequency and the oscillation frequency, a phase frequency detector to receive the reference frequency, and a third signal from an intermediate node from among the plurality of delay elements, and to output a phase difference between the reference frequency and the third signal, and a frequency detector to output a frequency error between the reference frequency and the oscillation frequency as a digital signal using an output signal of a phase frequency detector and the oscillation frequency.

The TDC 100 may be implemented as illustrated in FIG. 1 or FIG. 2. Since the converter, the phase frequency detector, and the frequency detector constituting the TDC 100 have been described in advance, detailed description is not repeated.

The digital loop filter 200 provides the digital control oscillator 300 with a digital control signal based on the phase error and the frequency error detected by the TDC 100.

The foregoing exemplary embodiments are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A time-to-digital converter (TDC), comprising:
   a converter which receives a first signal and a second signal, delays the second signal in phases using a plurality of delay elements which are coupled in series, compares the delayed second signal with the first signal, and outputs a phase error of the second signal with respect to the first signal;
   a phase frequency detector which receives the first signal, and a third signal from one of a plurality of nodes in the plurality of delay elements, and outputs a phase difference between the first signal and the third signal; and
   a frequency detector which outputs a frequency error of the second signal with respect to the first signal as a digital code using an output signal of the phase frequency detector and the second signal.

2. The TDC according to claim 1, wherein the converter comprises:
   a delay line which comprises the plurality of delay elements which are coupled in series, and receives the first signal through a start node;
   a plurality of comparators which compare phases of the nodes in the delay line with a phase of the second signal; and
   an encoder which outputs the phase error of the second signal with respect to the first signal as a digital code based on the plurality of comparators.

3. The TDC according to claim 2, wherein the delay elements are at least one of an inverter, a buffer, a resistor, and a resistor-capacitor (RC) delay circuit.

4. The TDC according to claim 2, wherein the comparator is a flip-flop.

5. The TDC according to claim 1, further comprising:
   an output device which changes the phase error output by the converter when the frequency error is input from the frequency detector.

6. The TDC according to claim 5, wherein the output device changes the phase error to a minimum value when a phase of the second signal is lagging behind a phase of the first signal, and
   the output device changes the phase error to a maximum value when a phase of the first signal is lagging behind a phase of the second signal.

7. The TDC according to claim 1, further comprising:
   a ring oscillator which is coupled with a plurality of delay elements in a feedback loop form, and outputs a preset oscillation frequency; and
   a counter which counts a period of the first signal and a period of the second signal using the oscillation frequency output by the ring oscillator.

8. The TDC according to claim 1, wherein one of the first signal and the second signal is a reference frequency.

9. An all-digital phase-locked loop (ADPLL), comprising:
   a digital control oscillator which receives a digital control signal and generates an oscillation frequency;
   a converter which receives a reference frequency, and the oscillation frequency generated by the digital control oscillator, delays the oscillation frequency in phases using a plurality of delay elements which are coupled in series, compares the delayed oscillation frequency with the reference frequency, and outputs a phase error of the oscillation frequency with respect to the reference frequency;
   a phase frequency detector which receives the reference frequency, and a third signal from an intermediate node in the plurality of delay elements, and outputs a phase difference between the reference frequency and the third signal;
   a frequency detector which outputs a frequency error of the oscillation frequency with respect to the reference frequency as a digital signal using an output signal of the phase frequency detector and the oscillation frequency; and a digital loop filter which provides the digital control oscillator with the digital control signal based on the phase error output by the converter and the frequency error output by the frequency detector.

10. The ADPLL according to claim 9, wherein the converter comprises:

a delay line which comprises the plurality of delay elements which are coupled in series, and which receives the oscillation frequency through a start node;

a plurality of comparators which compare phases of the nodes in the delay line with a phase of the reference frequency; and an encoder which outputs the phase error of the oscillation frequency with respect to the reference frequency as a digital code based on the plurality of comparators.

11. The ADPLL according to claim 10, wherein the delay elements are at least one of an inverter, a buffer, a resistor, and a resistor-capacitor (RC) delay circuit.

12. The ADPLL according to claim 10, wherein the comparator is a flip-flop.

13. The ADPLL according to claim 10, wherein the converter further comprises:

an output device which changes the phase error output by the converter if the frequency error is input from the frequency detector.

14. The ADPLL according to claim 13, wherein the output device changes the phase error to a minimum value if a phase of the oscillation frequency is lagging behind a phase of the reference frequency, and the output device changes the phase error to a maximum value if a phase of the reference frequency is lagging behind a phase of the oscillation frequency.

15. The ADPLL according to claim 10, wherein the converter further comprises:

a ring oscillator which is coupled with a plurality of delay elements in a feedback loop form, and outputs a preset oscillation frequency; and a counter which counts a period of the reference frequency and a period of the oscillation frequency using the oscillation frequency output by the ring oscillator.

* * * * *